(12) United States Patent
Touzard et al.

(10) Patent No.: US 8,217,719 B2
(45) Date of Patent: Jul. 10, 2012

(54) VARIABLE GAIN RF AMPLIFIER

(75) Inventors: Olivier Touzard, Grenoble (FR);
Véronique Tournier, Seyssinet-Pariset (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/781,518

(22) Filed: May 17, 2010

(65) Prior Publication Data

US 2010/0289583 A1 Nov. 18, 2010

Related U.S. Application Data

(63) Continuation of application No. 12/424,507, filed on Apr. 15, 2009, now abandoned.

(30) Foreign Application Priority Data

Apr. 18, 2008 (EP) ..................................... 08305110

(51) Int. Cl.
*H03F 3/45* (2006.01)
(52) U.S. Cl. .......................... 330/254; 330/260; 330/302
(58) Field of Classification Search .................. 330/254, 330/260, 302
See application file for complete search history.

(56) References Cited

U.S. PATENT DOCUMENTS

| 4,797,586 | A | * | 1/1989 | Traa | 327/276 |
|---|---|---|---|---|---|
| 5,337,025 | A | * | 8/1994 | Polhemus | 333/28 R |
| 5,939,917 | A | * | 8/1999 | Debaty | 327/246 |
| 6,316,996 | B1 | * | 11/2001 | Puotiniemi | 330/254 |
| 6,392,487 | B1 | | 5/2002 | Alexanian | |
| 6,744,319 | B2 | * | 6/2004 | Kim | 330/254 |
| 7,286,811 | B2 | | 10/2007 | Kral | |
| 2005/0057304 | A1 | | 3/2005 | Gilbert et al. | |
| 2009/0212855 | A1 | * | 8/2009 | Mitchell | 327/552 |

OTHER PUBLICATIONS

European Search Report dated Sep. 15, 2008 from related European Application No. 08305110, filed Apr. 18, 2008.
Yue et al: "*A 17..1-17..3-GHz Image-Reject Downconverter With Phase-Tunable LO Using 3<tex>StImes$</tex>Subharmonic Injection Locking*", IEEE Journal of Solid-State Circuits, IEEE Service Center, Piscataway, NJ, US, vol. 39, No. 12, Dec. 1, 2004, pp. 2321-2332, XPO11122669.
Moreira C P et al: *Dual-standard SiCMOS LNA for DCSI800/W-CDMA Applications*, Proceedings 18th. Symposium on Integrated Circuits and Systems Design. SBCCI 2005. Florianopolis, Brazil, Sep. 4-7, 2005; [Proceedings Symposium on Integrated Circuits and Systems Design] New York, NY,: ACM, US, Sep. 1, 2005, pp. 133-137, XP031124599.

* cited by examiner

*Primary Examiner* — Patricia Nguyen
(74) *Attorney, Agent, or Firm* — Wolf, Greenfield & Sacks, P.C.

(57) ABSTRACT

A variable gain amplifier having an input node, a variable current source including a control input coupled to the input node, first and second branches coupled in parallel between a first supply terminal and the variable current source, the first and second branches defining a differential pair arranged to be controlled by first and second differential gain signals and having first and second output terminals, one of the output terminals including an output node of the variable gain amplifier; and a potential divider having a middle node coupled to the first and second output terminals, wherein the middle node is also coupled to the input node by a capacitor.

32 Claims, 2 Drawing Sheets

US 8,217,719 B2

VARIABLE GAIN RF AMPLIFIER

CROSS REFERENCE TO RELATED APPLICATIONS

This application is a continuation of prior application Ser. No. 12/424,507, filed Apr. 15, which application claims the priority benefit of European patent application number 083095110.2, filed on Apr. 18, 2008, entitled "VARIABLE GAIN RF AMPLIFIER," which applications are hereby incorporated by reference to the maximum extent allowable by law.

BACKGROUND OF THE INVENTION

1. Field of the Invention

The present invention relates to a variable gain RF amplifier, and in particular to a low noise variable gain RF amplifier.

2. Discussion of the Related Art

RF (radio frequency) devices such as radio tuners, mobile telephones, satellite receivers, TV tuners etc. are devices that receive an RF signal. In such devices, input circuitry comprising a low noise amplifier (LNA) is generally provided for amplifying the received RF signal which is for example received via an antenna. The LNA should introduce as little noise as possible to the signal. To avoid unwanted reflections, the input impedance of the LNA is usually matched to the impedance of the antenna. Furthermore, the input circuitry generally includes a variable gain amplifier (VGA) coupled after the LNA, to adjust the amplitude of the RF signal to a range acceptable by downstream circuitry that is to process the RF signal.

A drawback with such RF input circuitry is that in providing a low noise amplifier coupled to a variable gain amplifier, the current consumption is relatively high, and a relatively large amount of area is needed. Furthermore, due to the number of components that are present through which the differential signal must pass, noise may be added to the system.

SUMMARY OF THE INVENTION

It is an aim of embodiments of the present invention to at least partially address one or more drawbacks in the prior art.

According to an aspect of the present invention, there is provided a variable gain amplifier comprising an input node; a variable current source comprising a control input coupled to the input node; first and second branches coupled in parallel between a first supply terminal and the variable current source, the first and second branches defining a differential pair arranged to be controlled by first and second differential gain signals and comprising first and second output terminals, one of the output terminals comprising an output node of the variable gain amplifier; and a potential divider comprising a middle node coupled to the first and second output terminals, wherein the middle node is also coupled to the input node by a capacitor.

According to an embodiment of the present invention, the potential divider comprises a first resistor coupling the middle node to the first output terminal and a second resistor coupling the middle node to the second output terminal.

According to another embodiment of the present invention, the first and second resistors have the same resistance value.

According to an embodiment of the present invention, the middle node is coupled to the input node by the capacitor coupled in series with a resistor.

According to an embodiment of the present invention, the current source comprises a transistor having a control terminal coupled to the input node, a first main current terminal coupled to a second supply terminal and a second main current terminal coupled to the first and second branches.

According to an embodiment of the present invention, the first branch comprises a first transistor having a control terminal arranged to receive the first differential gain signal, a first main current terminal coupled to the current source and a second main current terminal coupled to the first supply terminal; the second branch comprises a second transistor having a control terminal arranged to receive the second differential gain signal, a first main current terminal coupled to the current source, and a second main current terminal coupled to the first supply terminal; and the middle node of the potential divider is coupled to the second main current terminals of the first and second transistors.

According to an embodiment of the present invention, the variable gain amplifier further comprises a second input node; a second variable current source comprising a control input coupled to the second input node; third and fourth branches coupled in parallel between a first supply terminal and the variable current source, the third and fourth branches defining a differential pair arranged to be controlled by the first and second differential gain signals and comprising a second pair of output terminals, wherein the output node of the variable gain amplifier is a first output node of the variable gain amplifier and wherein one of the second pair of output terminals comprises a second output node of the variable gain amplifier; and a second potential divider comprising a middle node coupled to the second pair of output terminals, wherein the middle node is also coupled to the input node.

According to a further aspect of the present invention, there is provided an RF device comprising an input for receiving an RF signal and the above variable gain amplifier coupled to the input.

According to a further aspect of the present invention, there is provided a mobile device comprising the above variable gain amplifier.

According to a further aspect of the present invention, there is provided a satellite receiver comprising the above variable gain amplifier.

According to a further aspect of the present invention, there is provided a system comprising receiving circuitry for receiving an RF signal; an input node coupled to the receiving circuitry; a variable current source comprising a control input coupled to the input node; first and second branches coupled in parallel between a first supply terminal and the variable current source, the first and second branches defining a differential pair arranged to be controlled by first and second differential gain signals and comprising first and second output terminals; one of the output terminals comprising an output node of the variable gain amplifier; and a potential divider comprising a middle node coupled to the first and second output terminals, wherein the middle node is also coupled to the input node by a capacitor.

DETAILED DESCRIPTION

Figure 1:
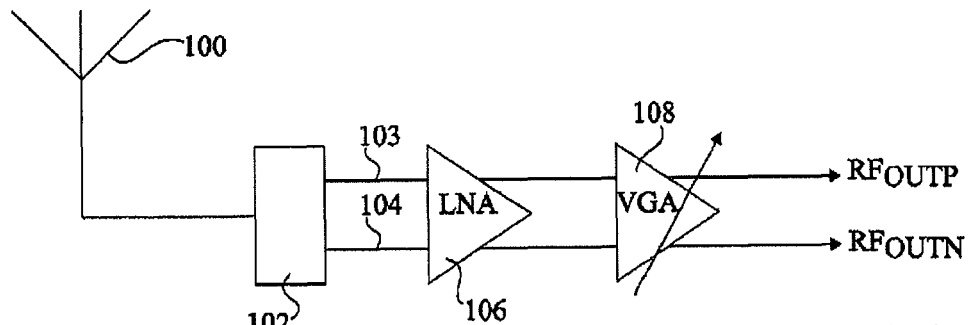
FIG. 1 schematically illustrates input circuitry for receiving an RF signal.

FIG. 1 illustrates input circuitry of an RF device for receiving an RF signal via an antenna 100. Antenna 100 is coupled to a balun 102, which converts an unbalanced signal into a balanced signal, and in particular the signal from the antenna into a differential signal comprising complementary parts. The differential signal is provided on two lines 103 and 104 to a low noise amplifier (LNA) 106, which amplifies the differential signal. The differential output of LNA 106 is coupled to a variable gain amplifier (VGA) 108, which amplifies the differential signal by a required amount such that the components of the differential output signal $RF_{OUTP}$ and $RF_{OUTN}$ have the required amplitudes. VGA 108 is controlled by a feedback loop.

Such an arrangement comprising separate circuitry for providing an LNA and a VGA has drawbacks, as discussed in the background section above. In particular, the LNA is likely to comprise at least one transistor for amplifying each part of the differential RF signal, while the VGA is likely to include a number of transistors for applying a variable gain to each part of the differential RF signal. Each stage adds current consumption to the device as well as area, and may also add noise to the RF signal.

Figure 2:
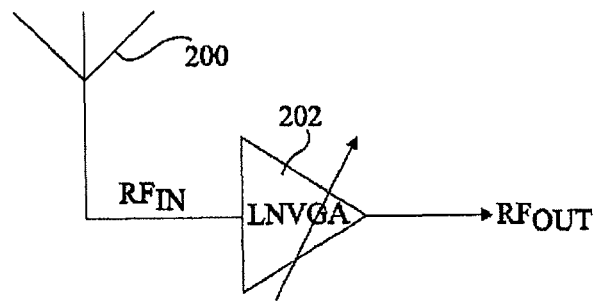
FIG. 2 schematically illustrates input circuitry according to an embodiment of the present invention comprising a low noise variable gain amplifier.

FIG. 2 illustrates input circuitry of an RF device comprising an antenna 200 and a low noise variable gain amplifier (from here onwards LNVGA) 202 having an input coupled to the antenna 200, for example via a high-pass filter, for receiving an RF input signal $RF_{IN}$, and an output $RF_{OUT}$, which in this example is a single-ended output. LNVGA 202 combines the functions of LNA 106 and VGA 108 of FIG. 1, but for amplifying a single-ended RF signal. By combining these blocks into one block, the number of components can be reduced, and consequently current consumption can be reduced, area of the device can also be reduced, and less noise is introduced into the RF signal.

Figure 3:
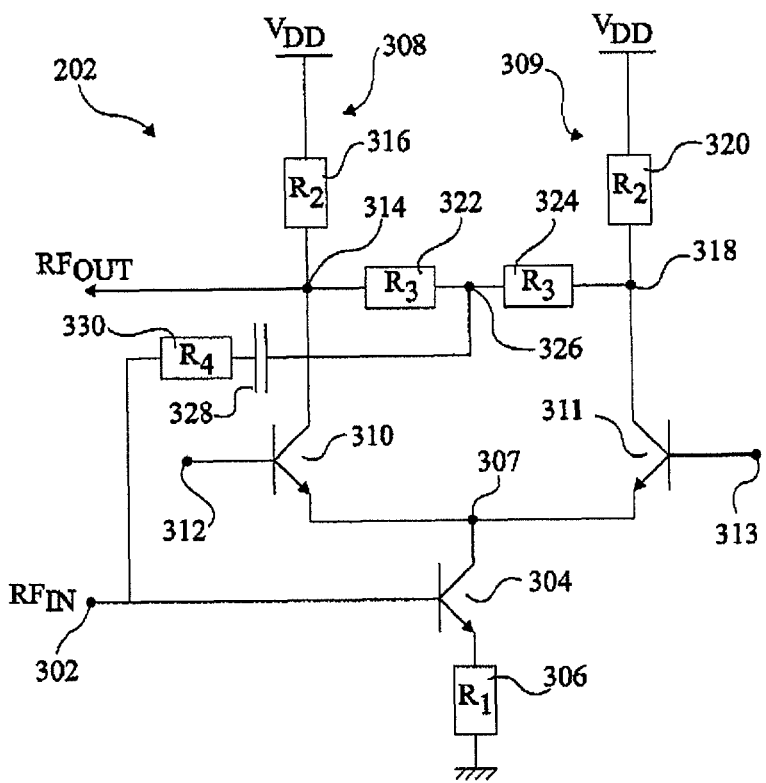
FIG. 3 is a circuit diagram of the low noise variable gain amplifier of FIG. 2 according to one embodiment of the present invention.

FIG. 3 is a circuit diagram illustrating the LNVGA 202 of FIG. 2 in more detail.

LNVGA 202 comprises an input node 302 coupled to the base terminal of a bipolar transistor 304, which has its emitter terminal coupled to a ground reference via a resistor 306, and its collector terminal coupled to a node 307. Transistor 307 provides a variable current source, controlled by an input signal applied to node 302.

Node 307 is coupled to branches 308, 309 which define a differential pair. In particular, branch 308 comprises a bipolar transistor 310 having an emitter terminal connected to node 307, while branch 309 comprises a bipolar transistor 311 having an emitter terminal coupled to node 307. The base terminals of transistors 310, 311 are coupled to nodes 312 and 313 respectively. Nodes 312 and 313 receive differential gain control signals generated by a feedback path from the output of the LNVGA 202. For example, node 312 receives a gain signal $V_{gainP}$ while node 313 receives a gain signal $V_{gainN}$, signals $V_{gainP}$ and $V_{gainN}$ being differential signals generated based on a feedback signal from the output of LNVGA 202.

By way of example, gain signals $V_{gainP}$ and $V_{gainN}$ are output by a single to differential attenuator with output common mode regulation and low output impedance. The single ended input to the attenuator is, for example, provided by a power sensor that senses the LNVGA output power.

The collector terminal of bipolar transistor 310 is coupled to a node 314, which is in turn coupled to the supply voltage level $V_{DD}$ via a resistor 316. The collector terminal of bipolar transistor 311 is coupled to a node 318, which is in turn coupled to the supply voltage level $V_{DD}$ via a resistor 320. Nodes 314 and 318 provide outputs of the differential pair provided by transistors 310 and 311. Furthermore, node 314 provides the output node of the LNVGA 202, providing the RF output signal $RF_{OUT}$.

Nodes 314 and 318 are coupled via respective resistors 322 and 324 of equal resistance, to a node 326, which is in turn coupled to the input node 302 via a capacitor 328 and resistor 330 coupled in series. Node 326 is a middle node of a potential divider provided by resistors 322 and 324 between nodes 314 and 318, and thus has a voltage level between the voltage levels of nodes 314 and 318, for example a voltage level halfway between these voltage levels.

In operation, node 302 is AC coupled to receive an RF input signal $RF_{IN}$, which in this example is the signal received via antenna 200 of FIG. 2, although in alternative embodiments the input signal could be received via a different communications path, such as a transmission cable. This RF signal is amplified by bipolar transistor 304, based on the values of resistors 306, 316, 320, 322, 324 and 330, and by the gain associated with bipolar transistors 310 and 311. In particular, assuming that coupling capacitors are high enough, transistors are ideal (very high gm, β and Early voltage and no parasitic capacitances) resistor 306 has a resistance $R_1$, resistors 316 and 320 have the same resistance $R_2$, resistors 322 and 324 the same resistance $R_3$, and resistor 330 a resistance $R_4$, the gain G defined as $RF_{OUT}/RF_{IN}$ can be expressed as:

$$G=R_2((R_1(R_2+R_3)-gR_3(R_2-R_3+2R_4)-R_4R_2))/R_1(R_2+R_3)(R_2+R_3+2R_4)\sim \quad (1)$$

"g" for example has a value between 0 and 1 and is a function of VgainP−VgainN. Assuming R3 is infinity, VoutN/VinP=−gR2/R1. When g is equal to 0, all current passes through transistor 311, whereas when g is equal to 1, all current passes through transistor 310.

Thus, the values of R1 to R4 can be chosen to provide a desired fixed gain of the circuit. As an example, the resistance values could be as follows: $R_1$=13 Ohms; $R_2$=200 Ohms; $R_3$=140 Ohms; and $R_4$=98 Ohms. These values result in a gain of the circuit of −1.281-6.335 g.

One of the aims of the circuitry of the variable gain amplifier 202 of FIG. 3 is to provide a circuit having an input impedance matched to the impedance of the input line whatever the gain selection (g value), to avoid reflections. The input line has an impedance associated with the antenna. To match this impedance, which is for example approximately 30 Ohms, a resistor 330 is provided, having a resistance R4, coupled between the input 302 and a node 326. Node 326 is at a mid voltage between nodes 314 and 318, achieved by connecting node 326 to node 314 and 318 respectively by resistors 322 and 324, which have equal resistances. Assuming the values $R_1$ to $R_4$ of the resistors in the circuit of FIG. 3, the input impedance $Z_{IN}$ can be expressed as follows:

$$Z_{IN}=R_1(R_2+R_3+2R_4)/(2R_1+R_2)$$

The numerical examples provided above thus provide an input impedance of approximately 31 Ohms.

Capacitor 328 provided between the input node 302 and node 326 prevents a DC connection between these nodes and is designed to provide low impedance at the operating frequency of the amplifier which is for example in the GHz range. Capacitor 328, for example, has a capacitance of approximately 20 pF, which is suitable for input frequencies of the input signal in a range of approximately 0.95 GHz to 2.15 GHz.

Figure 4:
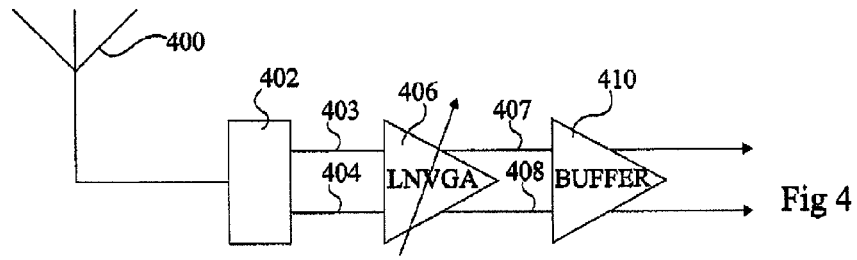
FIG. 4 schematically illustrates input circuitry for receiving an RF signal according to a further embodiment of the present invention comprising a low noise variable gain amplifier.

FIG. 4 illustrates RF input circuitry comprising an antenna 400 coupled to a balun 402, which generates a differential signal comprising a pair of complementary signals on lines 403, 404 based on the signal provided by the antenna 400. Lines 403, 404 are connected to an LNVGA 406. In this embodiment, the differential output of the LNVGA 406 on lines 407, 408 is provided to an output buffer 410, which is for example a push-pull buffer. The role of this buffer is to present a very low output impedance to cope with the input of the next block, which could be a matrix or mixer, for example.

Figure 5:
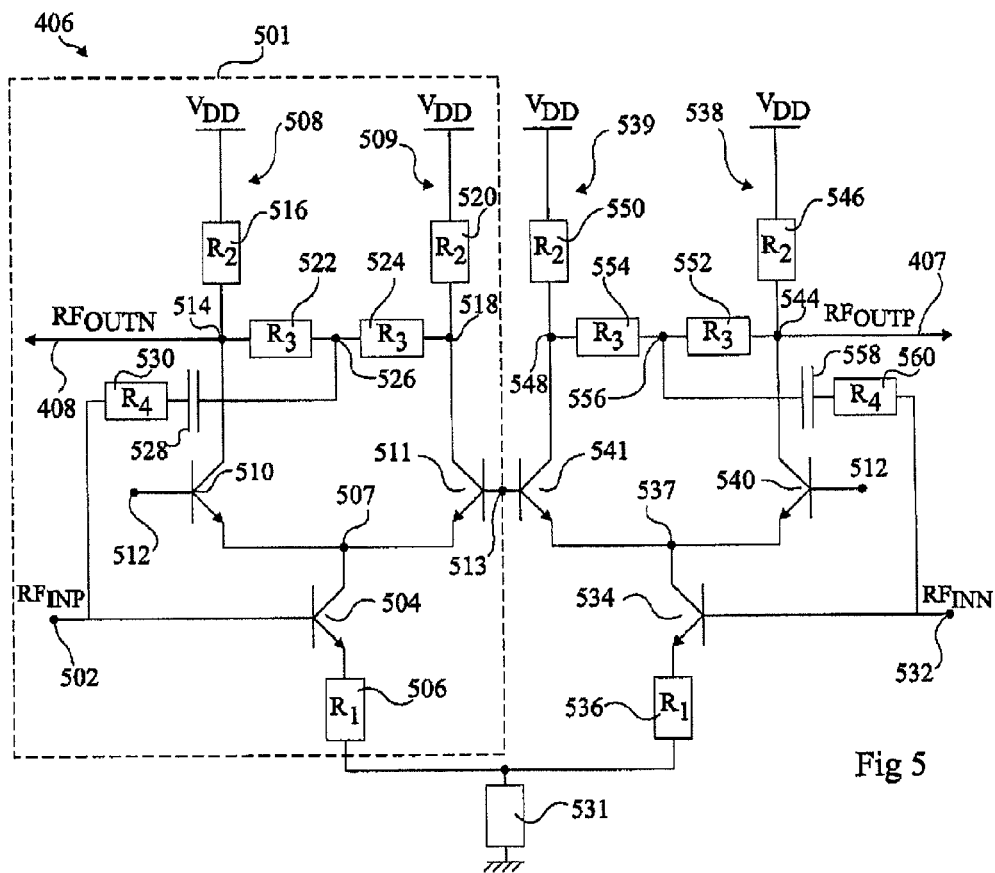
FIG. 5 is a circuit diagram of the low noise variable gain amplifier of FIG. 4 according to an embodiment of the present invention.

FIG. 5 illustrates the low noise variable gain amplifier 406 of FIG. 4 in more detail.

The left-hand side of circuitry 406 delimited by dashed box 501 is identical to the circuitry in FIG. 3, and has been labeled with the same reference numerals except that each numeral starts with a "5" rather than a "3". In particular, features labeled 502 to 530 correspond to features labeled 302 to 330 in FIG. 3, and these features will not be described again in detail.

Whereas resistor 306 in FIG. 3 is coupled to ground, resistor 506 in FIG. 5 is coupled to a grounded resistor 531, although in some embodiments resistor 506 could be coupled directly to ground.

The right hand side of circuitry 406 is an image of the left hand side, as will now be explained. The right hand side comprises an input node 532, coupled to the base terminal of a bipolar transistor 534, which has its emitter coupled to a resistor 536 which is in turn coupled to grounded resistor 531, and its collector terminal coupled to a node 537. As with transistor 504, transistor 534 provides a variable current source, controlled by the input signal provided at input node 532.

Node 537 is coupled to branches 538 and 539 that define a differential pair. Branch 538 comprises a bipolar transistor 540 having its emitter terminal connected to node 537, while branch 539 comprises a bipolar transistor 541 having its emitter terminal connected to node 537. The base terminal of bipolar transistor 541 is coupled to node 513 and in this embodiment, gain signal $V_{gainN}$ is, for example, applied at this node. The base terminal of bipolar transistor 540 is coupled to node 512, which, as descried above, receives a feedback gain signal $V_{gainP}$. Again, $V_{gainN}$ and $V_{gainP}$ are differential gain signals.

The collector terminal of bipolar transistor 540 is coupled to a node 544, which is in turn coupled to the supply voltage $V_{DD}$ via a resistor 546. The collector of bipolar transistor 541 is coupled to a node 548, which is in turn coupled to the supply voltage $V_{DD}$ via a resistor 550. Nodes 544 and 548 provide outputs of the differential pair provided by transistors 540 and 541. Furthermore, node 544 provides one of the differential output nodes of the LNVGA 406, providing the RF output signal $RF_{OUTp}$. The other differential output $RF_{OUTN}$ is provided by node 514 of the left hand side 501.

Nodes 544 and 548 are coupled to a node 556 via resistors 552 and 554 respectively. Node 556 is coupled to the input node 532 via a capacitor 558 and a resistor 560 coupled in series. Thus, node 556 is a middle node of a potential divider provided by resistors 552 and 554, and thus has a voltage level between the voltage levels of nodes 548 and 544, halfway between these voltage levels if resistors 552 and 554 have equal resistance.

The operation of the circuit in FIG. 5 is similar to that of FIG. 3, except that now there are differential input and output signals. The input signals $RF_{INP}$ and $RF_{INN}$ at nodes 502 and 532 respectively can be provided by an antenna, or different communications path, via a balun to generate the different components. The gain signals $V_{gainN}$ and $V_{gainP}$ provided at node 513 and to nodes 512 are based on a feedback signal, provided to circuitry that generates these differential gain signals. The gain $RF_{OUTP}/RF_{INN}$ or $RF_{OUTN}/RF_{INP}$ of the LNVGA 406 can be determined by formula (1) above, while the input impedance of each side of LNVGA 406 can be determined by formula (2) above, assuming that resistors 506 and 536 have resistance R1, resistors 516, 520, 546 and 550 have resistance R2, resistors 522, 524, 552 and 554 have resistance R3 and resistors 530 and 560 have resistance R4. In this embodiment, to match an impedance of 75 Ohms differential of the antenna, the input impedance of each side of LNVGA 406 is for example equal to 37.5 Ohms.

Figure 6:
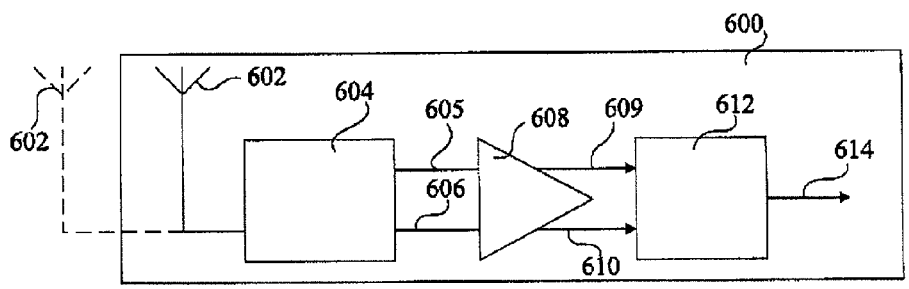
FIG. 6 schematically illustrates an RF device comprising a low noise variable gain amplifier according to an embodiment of the present invention.

FIG. 6 illustrates a device 600, which is an RF device arranged to receive an RF signal. The circuitry comprises an antenna 602, which, as illustrated, may be incorporated in device 600, or, as shown by the dashed line, it could be an external component coupled to device 600.

Antenna 602 is coupled to RF input circuitry 604, which comprises a low noise variable gain amplifier as described above and generates a differential signal having complementary components provided on lines 605 and 606. In this embodiment, the differential output of RF input circuitry 604 on lines 605 and 606 is coupled to a buffer 608, which in turn outputs a differential signal on lines 609, 610 to circuitry 612, which processes the received RF signal. Circuitry 612, for example, comprises an RF mixer and may also include a processor that converts the RF signal from the RF mixer into a digital signal or performs other processing on the signal, before providing an output on line 614, which could be coupled to an internal or external display (not shown in FIG. 6) or other output device.

An advantage of the embodiments of an LNVGA described herein is that in combining a low noise amplifier having input impedance matching with a variable gain amplifier in a single device, the number of components that the input RF signal passes through can be very low, and the current consumption and area of the device can be, for example, halved. In particular, in the above embodiments, a gain transistor, in other words a variable current source, and a differential pair are provided between each input and output node. A further advantage of the embodiments described above is that by coupling the input node to a mid point between differential outputs of the differential pair, such that the current flowing from the input node to this mid point does not depend on the gain g of the differential pair, a fixed input impedance can be provided at the same time as the variable gain functionality.

A further advantage of embodiments described herein is that by providing resistor 330, 530 and 560 coupling the input nodes to the potential dividers, the correlation between input impedance matching and gain variation range when g=0.5 can be reduced.

While a number of particular embodiments have been described, it will be apparent to those skilled in the art that various modifications can be applied.

For example, while in the described embodiments the transistors are described as being bipolar transistors such as bipolar junction transistors (BJT), in alternative embodiments other types of transistors could be used, and in particular one or more of the transistors could be replaced by MOS (metal oxide semiconductor) transistors. It will also be apparent to those skilled in the art that while all of the transistors illustrated in the various embodiments are NPN bipolar transistors, it would be possible to replace one or more of these by PNP bipolar transistors. However, advantageously, NPN transistors can generally provide a higher gain and faster response than PNP transistors.

Furthermore, it will be apparent that it would be possible to invert the circuits of FIG. 3 or 5, such that VDD and ground are inversed. The ground voltage level need not be at zero volts, while the supply voltage level could be positive or negative.

While the described embodiments include resistors 330, 530 and 560 coupled to the input nodes, it will be apparent that these could be removed. Furthermore, the potential divider provided by resistors 322 and 324 in FIG. 3, and potential dividers provided by resistors 522, 524 and 554, 552 in FIG. 5 could instead be provided by current sources.

It will also be apparent to those skilled in the art that while the embodiments of the LNVGA have been described as receiving an RF signal received from an antenna, the RF signal could be received from elsewhere, including other circuitry, or other communications paths.

Additionally, while the use of an output buffer has been described in relation to FIGS. 4 and 6, the embodiment of FIG. 2 could also include an output buffer positioned after the LNVGA.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A variable gain amplifier comprising:
   a first input node;
   a variable current source having a control input coupled to the first input node;
   first and second branches coupled in parallel between a first supply terminal and the variable current source such that current from each of the first and second branches can flow through main terminals of the variable current source, the first and second branches defining a differential pair arranged to be controlled by first and second differential gain signals and comprising first and second output terminals, one of the output terminals comprising a first output node of the variable gain amplifier; and
      a potential divider coupled between the first and second output terminals, the potential divider having a middle node coupled to the first input node.

2. The variable gain amplifier of claim 1, wherein the potential divider comprises a first resistor coupling the middle node to the first output terminal and a second resistor coupling the middle node to the second output terminal.

3. The variable gain amplifier of claim 2, wherein the first and second resistors have the same resistance value.

4. The variable gain amplifier of claim 1, wherein the middle node is coupled to the input node by a capacitor coupled in series with a resistor.

5. The variable gain amplifier of claim 1, wherein the variable current source comprises a transistor having a control terminal coupled to the first input node, a first main current terminal coupled to a second supply terminal and a second main current terminal coupled to the first and second branches.

6. The variable gain amplifier of claim 1, wherein:
   the first branch comprises a first transistor having a control terminal arranged to receive the first differential gain signal, a first main current terminal coupled to the variable current source and a second main current terminal coupled to the first supply terminal;
   the second branch comprises a second transistor having a control terminal arranged to receive the second differential gain signal, a first main current terminal coupled to the variable current source, and a second main current terminal coupled to the first supply terminal; and
   the middle node of the potential divider is coupled to the second main current terminals of the first and second transistors.

7. The variable gain amplifier of claim 1, further comprising:
   a second input node;
   a second variable current source having a control input coupled to the second input node;
   third and fourth branches coupled in parallel between the first supply terminal and a second variable current source, the third and fourth branches defining a differential pair comprising a second pair of output terminals, at least one of the third and fourth branches arranged to be controlled by the second differential gain signal and wherein one of the second pair of output terminals comprises a second output node of the variable gain amplifier; and
   a second potential divider coupled between the second pair of output terminals, the second potential divider having a middle node coupled to the second input node.

8. An RF device comprising:
   an input for receiving an RF signal;
   the variable gain amplifier of claim 1 coupled to the input.

9. A mobile device comprising the variable gain amplifier of claim 1.

10. A satellite receiver comprising the variable gain amplifier of claim 1.

11. A system comprising:
   receiving circuitry for receiving an RF signal;
   an input node of a variable gain amplifier coupled to the receiving circuitry;
   a variable current source having a control input coupled to the input node;
   first and second branches coupled in parallel between a first supply terminal and the variable current source, the first and second branches defining a differential pair arranged to be controlled by first and second differential gain signals and comprising first and second output terminals; one of the output terminals comprising an output node of the variable gain amplifier; and
   a potential divider coupled between the first and second output terminals, the potential divider having a middle node coupled to the input node by at least a capacitor.

12. The system of claim 11, wherein the system comprises an RF device selected from the group consisting of: a radio tuner, a television tuner, a mobile telephone, a satellite receiver, and a mobile electronic device.

13. The system of claim 11, wherein the potential divider comprises a first resistor coupling the middle node to the first output terminal and a second resistor coupling the middle node to the second output terminal.

14. The system of claim 13, wherein the first and second resistors have the same resistance value.

15. The system of claim 11, wherein the variable current source comprises a transistor having a control terminal coupled to the first input node.

16. The system of claim 11, wherein
the first branch comprises a first transistor having a control terminal arranged to receive the first differential gain signal; and
the second branch comprises a second transistor having a control terminal arranged to receive the second differential gain signal.

17. A variable gain amplifier comprising:
a first differential amplifier pair of transistors configured in first and second parallel circuit branches having a first output terminal and a second output terminal;
a first potential divider coupling the first output terminal and the second output terminal; and
a first signal input terminal coupled to a first middle node of the first potential divider and to a control node of a first variable current source, wherein the first variable current source is configured such that current from each of the first and second circuit branches can flow through main terminals of the first variable current source.

18. An RF device comprising the variable gain amplifier of claim 17.

19. The apparatus of claim 18, wherein the RF device is a device selected from the group consisting of: a radio tuner, a television tuner, a mobile telephone, a satellite receiver, and a mobile electronic device.

20. The variable gain amplifier of claim 17 further comprising a first variable current source having a first control input coupled to the first signal input terminal, the first variable current source coupled to the first differential amplifier pair.

21. The variable gain amplifier of claim 17 wherein the first potential divider comprises a first resistor coupling the first middle node to the first output terminal and a second resistor coupling the first middle node to the second output terminal.

22. The variable gain amplifier of claim 21 wherein the first and second resistors have the same resistance value.

23. The variable gain amplifier of claim 17 further comprising:
a second differential amplifier pair of transistors having a third output terminal and a fourth output terminal;
a second potential divider coupling the third output terminal and the fourth output terminal; and
a second signal input terminal coupled to a second middle node of the second potential divider.

24. An RF device comprising the variable gain amplifier of claim 23.

25. The apparatus of claim 24, wherein the RF device comprises a device selected from the group consisting of: a radio tuner, a television tuner, a mobile telephone, a satellite receiver, and a mobile electronic device.

26. The variable gain amplifier of claim 23 further comprising a second variable current source having a second control input coupled to the second signal input terminal, the second variable current source coupled to the second differential amplifier pair.

27. The variable gain amplifier of claim 23, wherein a base terminal of a transistor of the first differential amplifier pair of transistors is coupled to a base terminal of a transistor of the second differential amplifier pair of transistors.

28. A method for receiving an RF signal comprising:
receiving the RF signal at an input of an RF device; and
providing at least a first portion of the RF signal to a first middle node of a first potential divider, wherein the first potential divider couples a first output terminal and a second output terminal of a first differential amplifier pair of transistors.

29. The method of claim 28, wherein the RF device comprises a device selected from the group consisting of: a radio tuner, a television tuner, a mobile telephone, a satellite receiver, and a mobile electronic device.

30. The method of claim 28 further comprising:
providing at least a second portion of the RF signal to a second middle node of a second potential divider, wherein the second potential divider couples a third output terminal and a fourth output terminal of a second differential amplifier pair of transistors.

31. The method of claim 28 further comprising providing at least a second portion of the RF signal to a control input of a first variable current source, the first variable current source coupled to the first differential amplifier pair of transistors.

32. The method of claim 28 further comprising providing at least one gain control signal to a base terminal of one transistor of the first differential amplifier pair of transistors.

* * * * *